United States Patent
Lan et al.

(10) Patent No.: US 7,425,904 B2
(45) Date of Patent: Sep. 16, 2008

(54) KEYPAD CIRCUIT WITH ELECTROSTATIC DISCHARGE PROTECTION

(75) Inventors: Tzong-Hsiang Lan, Kaohsiung (TW); Chang-Tao Wu, Tainan (TW)

(73) Assignee: Qisda Corporation, Taoyuan (TW)

( * ) Notice: Subject to any disclaimer, the term of this patent is extended or adjusted under 35 U.S.C. 154(b) by 267 days.

(21) Appl. No.: 11/285,663

(22) Filed: Nov. 22, 2005

(65) Prior Publication Data

US 2006/0114130 A1    Jun. 1, 2006

(30) Foreign Application Priority Data

Nov. 23, 2004  (TW)  .............................. 93136016 A

(51) Int. Cl.
*H03M 11/00*    (2006.01)

(52) U.S. Cl. ........................... 341/22; 341/26; 379/368; 361/212

(58) Field of Classification Search ................... 341/26, 341/22; 379/368; 200/5 A, 305; 361/212
See application file for complete search history.

(56) References Cited

U.S. PATENT DOCUMENTS

| 5,335,137 A | 8/1994 | English et al. |
| 5,877,709 A | 3/1999 | Ala-Lehtimaki et al. |
| 6,323,445 B1 * | 11/2001 | Yee ............................ 200/5 A |

FOREIGN PATENT DOCUMENTS

EP           0 779 715           6/1997

* cited by examiner

*Primary Examiner*—Timothy Edwards, Jr.
(74) *Attorney, Agent, or Firm*—Ladas and Parry LLP

(57) ABSTRACT

A keypad device having a circuit of electrostatic discharge (ESD) protection is disclosed. The circuit has n and m numbers of column conductive lines and row conductive lines formed on the print circuit board wherein at least one column or row conductive line is connected to the ground and the others are, respectively, connected to the data input terminals and data output terminals of the keypad encoder. The intersections between the column (row) line which is grounded and the row (column) lines are designed for those keys, which are readily attacked by ESD such as the side keys.

5 Claims, 3 Drawing Sheets

KEYPAD CIRCUIT WITH ELECTROSTATIC DISCHARGE PROTECTION

BACKGROUND OF THE INVENTION

1. Field of the Invention

The invention relates to a keypad scanning circuitry used in an electronic device, particularly a keypad scanning circuitry with an ESD protection function.

2. Description of the Prior Art

In recent years, kinds of portable consumer electronic products have been improved. Various fancy features and functions are added. Slim, compact and lightweight designs have become the mainstream of the market and even the norms of the industry. With regard to mobile communication devices such as cellular phones, variety of rich tone rings and color screen displays have long ago considered by consumers as the very basic of features. Keypads designed with ergonomics in mind are no longer a rarity and have often been a much advertised feature for many manufacturers. Foldable cell phones do not require the use of a set of lock keys to protect against unwanted depression of keys, while the flip lid, the upper part of the cell phone, can be used for accommodating such added features as digital cameras, timepiece, in-coming call number show-ups, and various message displays etc., As a result, flip cell phones have always enjoyed better popularity among consumers than non-flip cell phones.

To allow for easy operation of their cell phones, cell phone manufacturers often have some of their cell phones' operation keys built on the sides of the cell phone case, making it possible for the user to operate single-handedly such functions as dialing, recording, and volume controlling etc., However, as cell phones are being made smaller and smaller, the possibility that they get such severe electrostatic shocks as to damage their internal IC circuitry or the ITO cables inside the LCD display module is also increasing. As a result, the higher the resolution of a cell phone's LCD display is, the smaller the side keys become, and the more difficult the task of designing ESD protection for the phone will be.

When a naked side key of a cell phone is in direct contact with foreign objects in its surrounding, friction can cause electrostatic charges to be generated and accumulated, and later discharged through the side key into the cell phone's internal ICs, causing irreparable damages.

Another peril comes from the cell phone user. In a very dry environment, the very electrostatic a person generates can easily reaches 1 KV or 2 KV, which, if discharged through the side keys, is sufficient to cause havoc to the cell phone's internal ICs.

As a result, most manufacturers have to design ESD protection, in addition to magnetic disruption protection, into their cell phones. Some, for instance, provide silver foil shields for the internal parts of their cell phones. Others try to come up with new circuitry designs for their keypad scanning devices to combat the problem.

With regard to the latter way of solution, prior art keypad scanning devices have their IC matrix arranged on two sides: the input side and the output side—with row conductive lines on one side and column conductive lines on the other, and intersections of row lines and column lines set for detecting key depression. Thus, when, for example, the area where row line I (say, on the output side) intersects column line J (say, on the input side) is pressed, the two lines (the output line and the input line) will reach the same potential simultaneously, which the IC interprets as the corresponding key being pressed, and hence, immediately send out a signal. To provide for ESD protection, most manufacturers arrange their PC board layout in such ways that the intersecting areas 10, 20 of column and row lines shape like that of a doughnut. The area where resistance is low (the output side of IC) is arranged in the center; the area where resistance is high (the input side of IC) is arranged in the outer periphery, the consideration being that resistance on the output side is usually smaller than that on the input side, and ESD generally strikes through paths where resistance is smaller.

Although resistance on the input side is usually greater, which offers better protection against ESD, keys on the side of a slim design cell phone is often still susceptible to the strikes of ESD because the input line beneath these keys cannot accommodate ample contact area, which surrounds the output line's contact and protects it against ESD strikes. Thus protection is thus inadequate and is easy for ESD to strike through these side keys and damage the keypad encoder's IC. For this reason, some extra ESD protection is needed to ensure that the keypad encoder IC won't be damaged before input signals are transmitted into it.

The present invention introduces a new perspective to the current ESD protection thinking. It is not necessary for the internal parts of the cell phone to be equipped with ESD protection shields, just a little creative thinking and the problem can be substantially alleviated.

SUMMARY OF THE INVENTION

An electronic device comprising a keypad encoder and a keypad scanning circuitry with an innovative layout that provides protection against ESD strikes. The circuit has n numbers of column conductive lines and m numbers of row conductive lines formed on the print circuit board wherein at least one row or column conductive line is connected to the ground and the others are connected, respectively, to their corresponding data input terminals and data output terminals on the keypad encoder. The row lines that intersect with the grounded column lines are connected to the data output terminals, and the column lines that intersect with the grounded row lines are connected to the data input terminals; these data input and output conductive lines are reserved for keys susceptible to ESD attacks, particularly keys located on the slim sides of the cell phone casing. With this layout, when an ESD strike does occur, the ESD will be directed to the ground rather than to the keypad encoder (encoding IC).

Cell phones using this design will have no need for extra ESD protection parts, and are thus free from the problem of these parts' aging. Nearly all ESD attacks are directed to the ground, and the keypad encoding IC will no longer be subject to ESD strikes.

BRIEF DESCRIPTION OF THE DRAWINGS

The present invention will be more fully understood from the detailed description, which will be given hereinafter, with the aid of the illustrations below.

DESCRIPTION OF THE PREFERRED EMBODIMENT

Before explaining the disclosed embodiment of the present invention in detail it is to be understood that the invention is not limited in its application to the details of the particular arrangement shown here since the invention is capable of other embodiments. Also, the terminology used herein is for the purpose of description and not of limitation.

In view of the fact that prior art keypad scanning devices provides only very limited ESD protection, and that ESD is likely to strike through side keys or any crevices around cell phone casings, damaging the IC circuit below, the present invention introduces a new way of building ESD protection into the IC designs of the keypad encoder. With this new invention, It is no longer necessary for the internal parts of the cell phone to be equipped with ESD protection shields, and enormous extra costs are saved.

The following is the detailed description of a preferred embodiment of the invention, which is an electronic device comprising a keypad encoder IC and a keypad scanning circuitry that provides protection against ESD. The protection is obtained by having some keys, particularly side keys that are susceptible to ESD strikes, scanned by conductive lines connected to the ground.

Figure 2A:
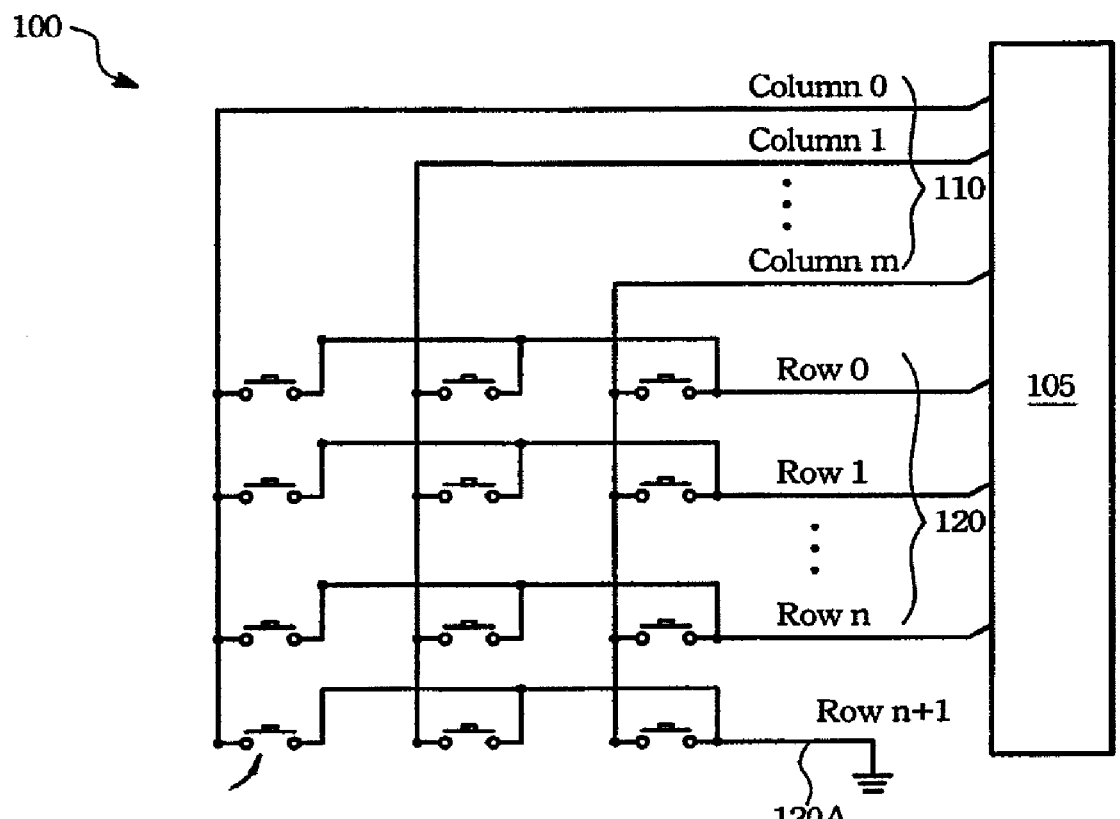
FIG. 2A shows the layout of a keypad scanning circuit designed in accordance with the present invention, with one row conductive line connected to the ground.
Figure 2:
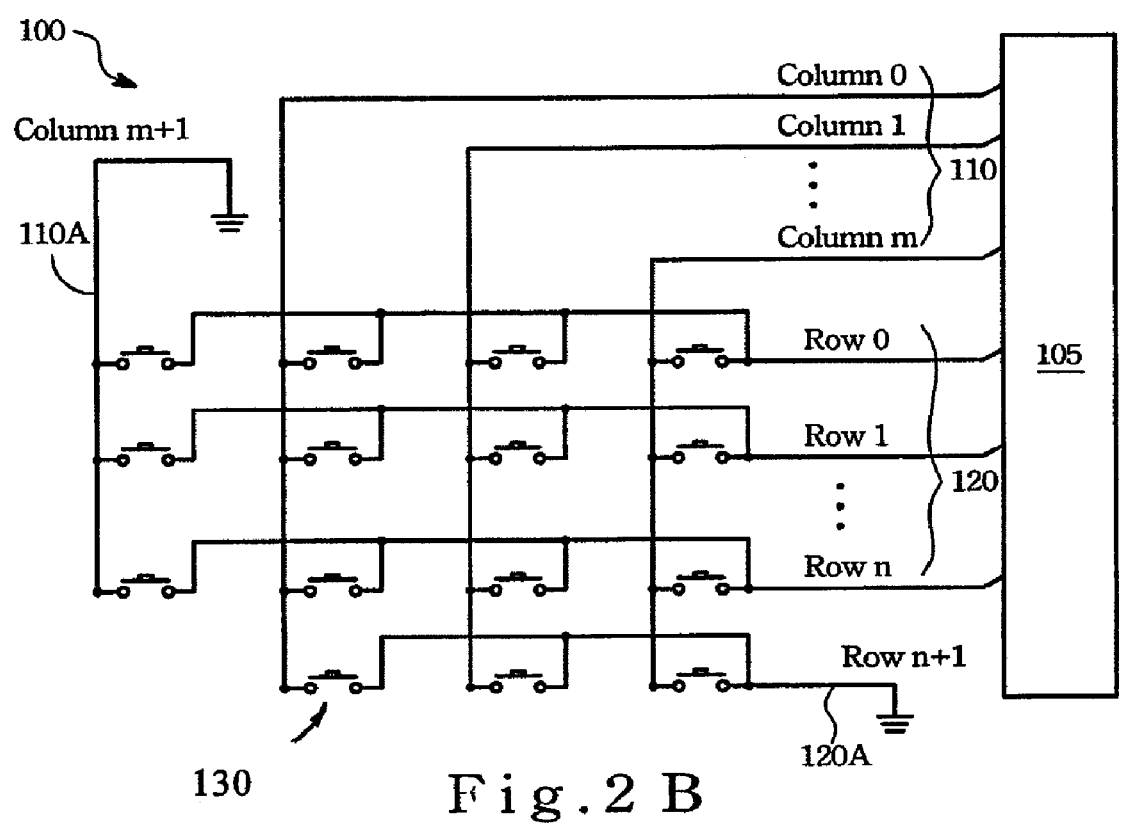
FIG. 2B shows one row conductive line and one column conductive line connected to the ground in accordance with the present invention.

FIG. 2A shows an electronic device 100 that comprises a keypad encoding IC 105 having a plurality of column conductive lines 110 such as m column lines and a plurality of row conductive lines 120 such as (n+1) row lines connected to it. As the IC layout in FIG. 2A shows, among the (n+1) row conductive lines on the keypad encoding IC, one 120A, the row $(n+1)^{th}$, is not connected to the encoder IC, but is connected to the ground. Spots where column lines 110 intersect row lines 120 are positions for keys 130. When a key is depressed, the intersecting row lines and column lines will immediately reach the same potential, telling the IC to send out a signal.

One can also opted to have one of the column conductive lines 110 connected to the ground, instead of having the row conductive line 120A connected to it. As is shown in FIG. 2B, one can even have one column conductive line 110A and one row conductive line 120A grounded, but not two or more than two row conductive lines grounded. The reason is due to the fact if the IC detects that one column conductive line and two or more than two row conductive lines are connected to the ground, it won't be able to tell which key on the various row conductive lines is pressed. One thing must be noted: the one row conductive line 120A or column conductive line 110A chosen to be grounded must be those that are connected to keys susceptible to ESD strikes, particularly naked side keys located on the narrow edge of a cell phone casing.

Figure 1:
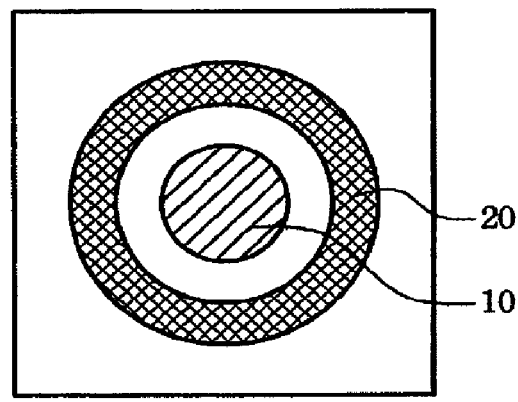
FIG. 1 shows the layout of a prior art keypad scanning circuit, wherein data output contact areas are in the center, while the data input contact areas are in the outer periphery, with the layout shaped like a doughnut.
Figure 3:
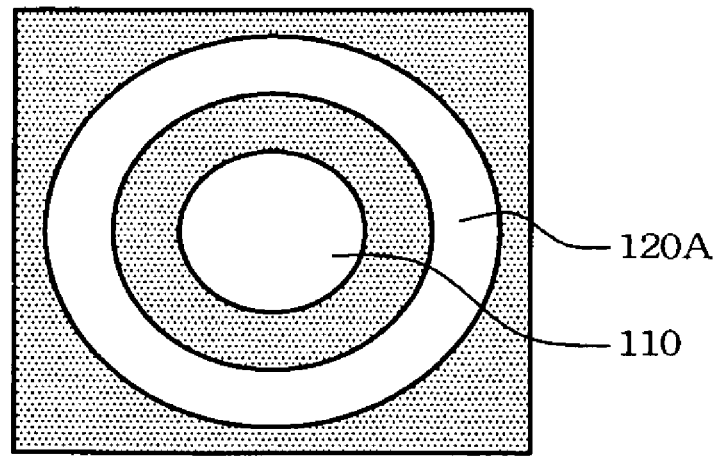
FIG. 3 shows an electronic device, designed in accordance with the present invention, wherein the keypad scanning circuit has its data output contact areas located in the center, and data input contact areas connected to the ground.
Figure 4:
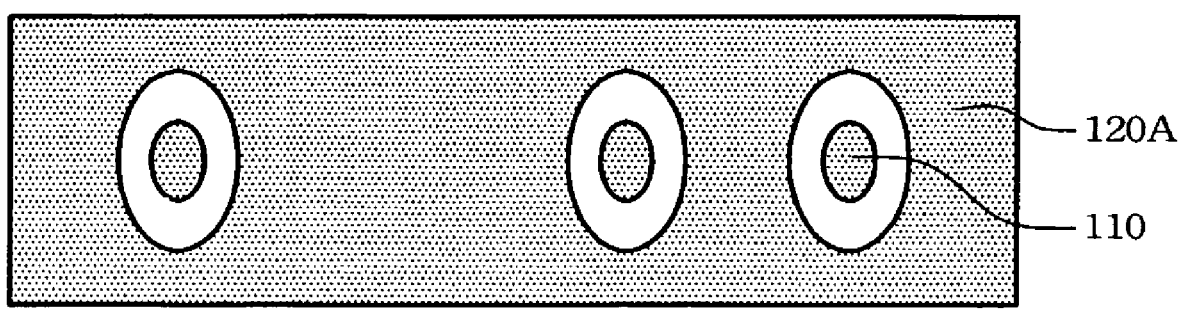
FIG. 4 shows the layout of a keypad scanning circuit designed in accordance with the present invention, with data output contact areas located in the center, and data input contact areas connected to the ground.

FIG. 3 shows a schematic layout designed of a printed circuit board for side keys in accordance with the present invention. Like that in FIG. 1, the column contact area 110 is a solid circular formed with copper foil, while the row contact area 120A is shaped like a circular ring also made of conducting copper foil, with a bare insulating region placed in between. What is different (from that in FIG. 1) is that the row contact area 120A is connected to the ground instead of the data input terminal. FIG. 4 shows another printed circuit board layout designed in accordance with the present invention. The row conductive trace 120A presents as a band and is insulated from the column contact areas 110 by insulating rings.

Advantages of this creative layout design can be summarized as below:

1. The column contact area is located in the inner circle and is enveloped by the ground in the outer that all the lines that are connected to the IC are protected by the ground against ESD.

2. ESD is a kind of electrostatic charge movement from a region of high charge density toward a region with opposite charge type or a region with lower charge density and when the ground is located in the outer area, it is also the low charge area. The electrostatic charge is thus likely to be released straight to the ground.

3. The ground is, actually, the bare copper part on the PCB, which is gold-plated against oxidization. So there is no aging problem for the parts.

4. Because this invention relieves the use of extra ESD protection parts, it not only helps save cost, but better allows for products to be made smaller and lighter.

As is understood by a person skilled in the art, the foregoing preferred embodiment of the present invention is an illustration, rather than a limiting description, of the present invention. It is intended to cover various modifications and similar arrangements included within the spirit and scope of the appended claims, the scope of which should be accorded the broadest interpretation so as to encompass all such modifications and similar structures.

What is claimed is:

1. A keypad circuit having side keys with ESD protection, said keypad layout comprising:

an array of conductive lines with n+1 row conductive lines and m column conductive lines formed on a print circuit board, the n row conductive lines and the m column conductive lines being respectively connected to data input terminals and data output terminals of a keypad encoder, the one remnant row conductive line $(n+1)^{th}$ being connected to the ground so that n by m first intersected spots and 1 by m second intersected spots are constituted, said side keys are seated on said second intersected spots so that a ground potential is obtained as a side key is stroked and a potential of a column conductive line is equal to a potential of a row conductive line as a key seated on one of said first intersected spots is stroked.

2. The keypad circuit as described in claim 1, wherein said second intersected spots are a copper foil band formed therewith m insulted rings, each of said insulted rings, respectively, connected with each of said m conductive lines, said copper foil band outside said m insulated rings is conducted to ground.

3. The keypad circuit as described in claim 1, further comprising one grounded column conductive line $(m+1)^{th}$ intersected with said n row conductive lines so as to constitute 1 by n third intersected spots for keys, whose locations susceptible to ESD.

4. An electronic device, said electronic device comprising:
a keypad encoder having first terminals and second terminals;
a first array of conductive lines formed on a print circuit board with n row conductive lines and m column conductive lines intersected to form n by m first intersected spots provided for first keys seated thereon, said first terminals connected with said n row conductive lines and said second terminals connected with said m column conductive lines;

a the print circuit board constituted of a copper foil with a pattern of m insulated rings formed thereon, m internal conductive areas of said m insulted rings connected, respectively, with other ends of said m column conductive lines, an outside area of said insulated rings being grounded, each of said m insulated rings, the internal area enclosed, provided for a side key seated crossover, so that as said side key is pressed, the column conductive line connected with the internal area will be grounded.

5. An electronic device, comprising:

a print circuit having an array of conductive lines formed of n row conductive lines and m column conductive lines intersected to form n by m first intersected spots, wherein said m column conductive lines are also connected with their first ends, respectively, connected to m internal areas of m insulated rings formed on a ground plane, and both of said ground plane and said m internal areas are conductive;

a keypad encoder having first terminals and second terminals, said m column conductive lines with all the other ends connected to said first terminals, respectively, and said n row conductive lines with all their one ends connected said second terminals, respectively, a plurality of side keys, each seated crossover an insulated ring of said m insulated rings, so that the corresponding column conductive line connected with the internal area of the insulated ring will be bridged to said ground plane as one of said side keys is pressed;

a plurality of first keys, each seated on one of said first intersected spots so that the corresponding first terminal end and second terminal intersected at the corresponding first intersected spot will be bridged to the same potential as one of said first keys is pressed.

* * * * *